(12) United States Patent
Sakaguchi (10) Patent No.: US 11,695,406 B2
(45) Date of Patent: Jul. 4, 2023

(54) OVERCURRENT PROTECTION CIRCUIT AND LOAD DRIVING DEVICE

(71) Applicant: ABLIC Inc., Tokyo (JP)

(72) Inventor: Kaoru Sakaguchi, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/453,903

(22) Filed: Nov. 8, 2021

(65) Prior Publication Data

US 2022/0190815 A1   Jun. 16, 2022

(30) Foreign Application Priority Data

Dec. 15, 2020   (JP) .................. 2020-207209

(51) Int. Cl.
G05F 1/573     (2006.01)
H03K 17/082    (2006.01)
H02H 3/08      (2006.01)

(52) U.S. Cl.
CPC ......... *H03K 17/0822* (2013.01); *G05F 1/573* (2013.01); *H02H 3/08* (2013.01); *H03K 17/082* (2013.01)

(58) Field of Classification Search
CPC .. H03K 17/0822; H03K 17/082; H03K 17/08; H03K 17/08104; G05F 1/573; H02H 3/08; G01R 19/165

USPC .................. 361/86–87, 93.7–93.9
See application file for complete search history.

(56) References Cited

U.S. PATENT DOCUMENTS

| | | | |
|---|---|---|---|
| 2007/0076342 A1* | 4/2007 | Arndt ................ | H03K 17/0822 361/103 |
| 2008/0265852 A1* | 10/2008 | Imura .................... | G05F 1/575 323/277 |
| 2014/0253070 A1* | 9/2014 | Sakaguchi ............. | G05F 1/573 323/273 |
| 2018/0123578 A1* | 5/2018 | Chauhan ........... | G01R 19/0092 |
| 2018/0287485 A1* | 10/2018 | Sakaguchi ............. | H02M 1/08 |

FOREIGN PATENT DOCUMENTS

| | | |
|---|---|---|
| JP | 2006-276990 A | 10/2006 |
| JP | 2008-276477 A | 11/2008 |

* cited by examiner

*Primary Examiner* — Danny Nguyen
(74) *Attorney, Agent, or Firm* — Pearne & Gordon LLP (57) ABSTRACT

An overcurrent protection circuit configured to limit an output current flowing through an output transistor includes a sense transistor that provides a sense current proportional to the output current, a sense resistor through which the sense current flows, a current limiting circuit that detects a sense voltage generated by the sense resistor and controls a gate voltage of the output transistor, and a current correction circuit that provides the sense resistor with a corrected sense current added to the sense current based on a difference of voltage between a drain voltage of the output transistor and a drain voltage of the sense transistor.

10 Claims, 5 Drawing Sheets

OVERCURRENT PROTECTION CIRCUIT AND LOAD DRIVING DEVICE

TECHNICAL FIELD

The present invention relates to an overcurrent protection circuit and a load drive device.

BACKGROUND ART

A voltage regulator, a high-side switch, or the like is known as a load drive device that supplies a current to a load. In order to prevent the load drive device from being destroyed by an overcurrent or a voltage of the load from increasing rapidly, the load drive device includes an overcurrent protection circuit that limits a current of an output transistor supplying an output current.

A circuit which includes a sense transistor for providing a sense current proportional to an output current provided by an output transistor to reduce the output current of the output transistor in a case of detecting the sense current that increases more than a predetermined value is proposed as one of configurations of an overcurrent protection circuit (refer to, for example, JP-A-2006-276990).

In such a circuit, in a case where a source-drain voltage of the output transistor does not coincide with a source-drain voltage of the sense transistor, a ratio between the output current and the sense current may change due to influence of a channel length modulation effect. As a countermeasure against this, a circuit controlling a drain voltage of the sense transistor is provided so as to make a drain voltage of the output transistor coincide with the drain voltage of the sense transistor; thus, reduction in detection accuracy of an overcurrent can be suppressed.

A conventional circuit may limit an operating voltage of a circuit for making a drain voltage of an output transistor coincide with a drain voltage of a sense transistor. In this case, it is difficult to make the drain voltage of the output transistor coincide with that of the sense transistor depending on a voltage of an output terminal of the load drive device.

Specifically, in a circuit of FIG. 1 of JP-A-2006-276990, in the case of a high voltage of the output terminal, the operation is performed such that drain voltages of an output transistor M1 and a sense transistor M2 coincide with each other. In the case of a grounded output terminal due to a factor such as a short-circuit between wires and 0 V of the drain voltage of the output transistor M1, a voltage obtained by adding a source-drain voltage of a PMOS transistor M3 to a voltage generated by the PMOS transistor M3 and a sense resistor R3 is higher than a ground voltage, and thereby, the drain voltage of the sense transistor M2 does not become 0 V. Due to a difference in drain voltage between the output transistor M1 and the sense transistor M2, a ratio between an output current and a sense current changes due to influence of a channel length modulation effect; thus, detection accuracy of an overcurrent is reduced.

An aspect of the present invention provides an overcurrent protection circuit capable of maintaining high detection accuracy of an overcurrent even in the case of a grounded output terminal.

An overcurrent protection circuit according to an aspect of the present invention is an overcurrent protection circuit configured to limit an output current flowing through an output transistor, and includes a sense transistor through which a sense current proportional to the output current flows, a sense resistor through which the sense current flows, a current limiting circuit that detects a sense voltage generated in the sense resistor and controls a gate voltage of the output transistor, and a current correction circuit that causes a corrected sense current added to the sense current to flow through the sense resistor based on a difference of voltage between a drain voltage of the output transistor and a drain voltage of the sense transistor.

According to an aspect of the present invention, it is possible to provide an overcurrent protection circuit capable of maintaining high detection accuracy of an overcurrent even in the case of a grounded output terminal.

DESCRIPTION OF EMBODIMENTS

Hereinafter, embodiments of the present invention will be described with reference to the drawings.

First Embodiment

Figure 1:
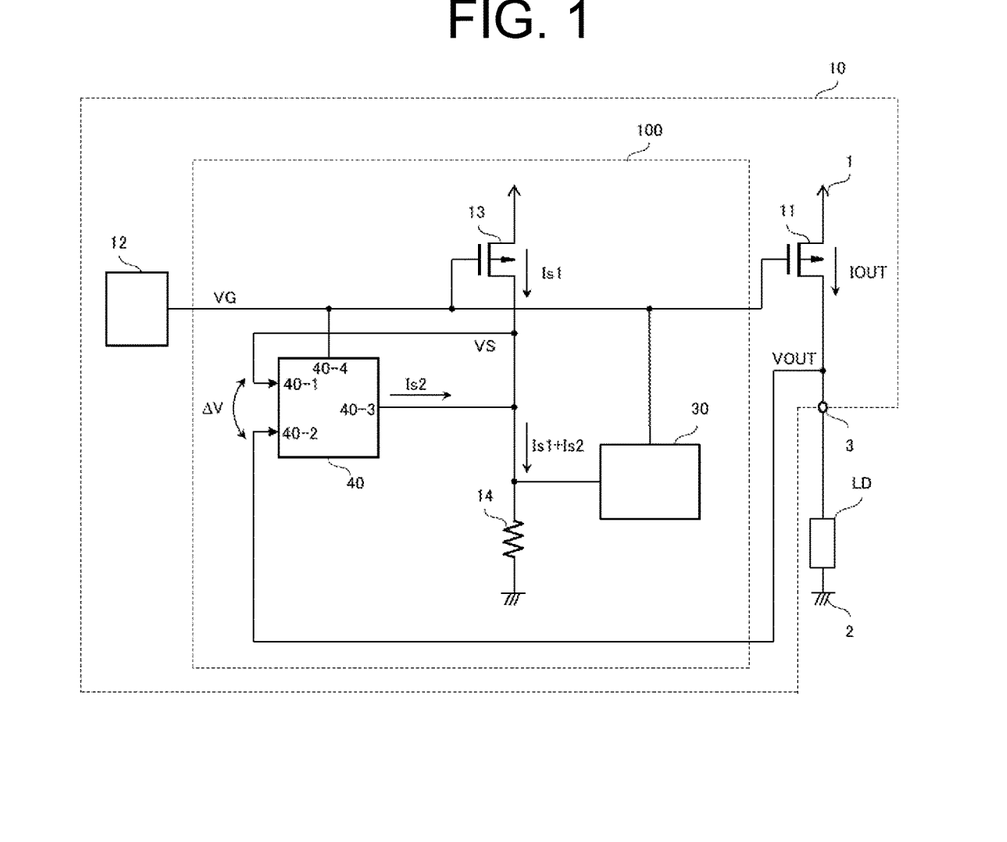
FIG. 1 is a circuit diagram illustrating an overcurrent protection circuit according to a first embodiment of the present invention.

FIG. 1 is a circuit diagram illustrating an overcurrent protection circuit according to a first embodiment of the present invention.

The circuit of FIG. 1 illustrates a load drive device 10 including an overcurrent protection circuit 100. The load drive device 10 includes an output transistor 11, a control circuit 12, and an overcurrent protection circuit 100.

A load LD is connected to an output terminal 3 outside the load drive device 10.

The overcurrent protection circuit 100 includes a sense transistor 13, a sense resistor 14, a current limiting circuit 30, and a current correction circuit 40 and operates to limit an output current IOUT of the output transistor 11.

The output transistor 11 and the sense transistor 13 are PMOS transistors.

A connection between the load drive device 10 and the overcurrent protection circuit 100 of FIG. 1 will be described.

A source of the output transistor 11 is connected to a power supply terminal 1. A gate of the output transistor 11 is connected to an output terminal of the control circuit 12, a gate of the sense transistor 13, an output terminal of the current limiting circuit 30, and a control terminal 40-4 of the current correction circuit 40. A drain of the output transistor 11 is connected to an output terminal 3 and a second input terminal 40-2 of the current correction circuit 40.

A source of the sense transistor 13 is connected to the power supply terminal 1. A drain of the sense transistor 13 is connected to one terminal of the sense resistor 14, an input terminal of the current limiting circuit 30, and a first input terminal 40-1 and an output terminal 40-3 of the current correction circuit 40. The other terminal of the sense resistor 14 is connected to a ground terminal 2.

Operations of the load drive device 10 and the overcurrent protection circuit 100 of FIG. 1 will be described.

The output transistor 11 provides an output current IOUT via the output terminal 3 in order to supply a power supply current to the load LD.

The control circuit 12 controls a gate voltage VG of the output transistor 11.

Since a gate-source voltage of the sense transistor 13 is equal to a gate-source voltage of the output transistor 11, the sense transistor 13 provides a sense current Is1 proportional to the output current IOUT.

Here, a drain voltage of the output transistor 11 is referred to as an output voltage VOUT, and a drain voltage of the sense transistor 13 is referred to as a sense voltage VS.

The current correction circuit 40 receives the sense voltage VS through the first input terminal 40-1 and the output voltage VOUT through the second input terminal 40-2 and provides a corrected sense current Is2 based on a voltage difference $\Delta V$ between the sense voltage VS and the output voltage VOUT.

The sense current Is1 and the corrected sense current Is2 are added together to flow to the sense resistor 14, and the sense voltage VS is generated at both ends of the sense resistor 14. If the output current IOUT increases, the sense current Is1 increases in proportion to the output current IOUT, and thus, the sense voltage VS increases. If the sense voltage VS is equal to or higher than a predetermined voltage, the current limiting circuit 30 controls the gate voltage VG of the output transistor 11 so as to prevent an increase of the output current IOUT. Since output drive capability of the current limiting circuit 30 is higher than output drive capability of the control circuit 12, control by the current limiting circuit 30 has priority over control by the control circuit 12.

By such an operation, the overcurrent protection circuit 100 limits a current to prevent the output transistor 11 from flowing the output current IOUT equal to or greater than a predetermined value.

Here, in the case of limiting the output current IOUT of the output transistor 11 by using the overcurrent protection circuit 100, the output voltage VOUT, that is, a drain voltage of the output transistor 11 is determined by impedance of the load LD and a limit value of the output current IOUT. In the case of grounding, the output voltage VOUT becomes 0 V. Meanwhile, the sense voltage VS which is the drain voltage of the sense transistor 13 is determined by a voltage generated by the sense resistor 14.

As such, since the respective voltages of the output voltage VOUT and the sense voltage VS are determined by different factors, the drain voltage of the output transistor 11 hardly coincides with the drain voltage of the sense transistor 13. If a source-drain voltage VDS of the output transistor 11 and a source-drain voltage VDS of the sense transistor 13 are different from each other, a ratio (IOUT/Is1) between the output current IOUT and the sense current Is1 changes depending on a VDS difference due to a channel length modulation effect.

In contrast to this, the current correction circuit 40 provides the corrected sense current Is2 based on a difference of voltage $\Delta V$ between the output voltage VOUT and the sense voltage VS so as to cancel a change in the ratio between the output current IOUT and the sense current Is1. As a result, a ratio between the output current IOUT and a current Is1+Is2 flowing through the sense resistor 14 is constant regardless of the difference of voltage $\Delta V$ between the output voltage VOUT and the sense voltage VS.

As such, according to the overcurrent protection circuit 100 of the first embodiment, even in a case where the output terminal 3 is grounded and the drain voltage of the output transistor 11 does not coincide with the drain voltage of the sense transistor 13, a current exactly proportional to the output current flows through the sense resistor 14; thus, high detection accuracy of an overcurrent can be maintained without being affected by the channel length modulation effect.

Figure 2:
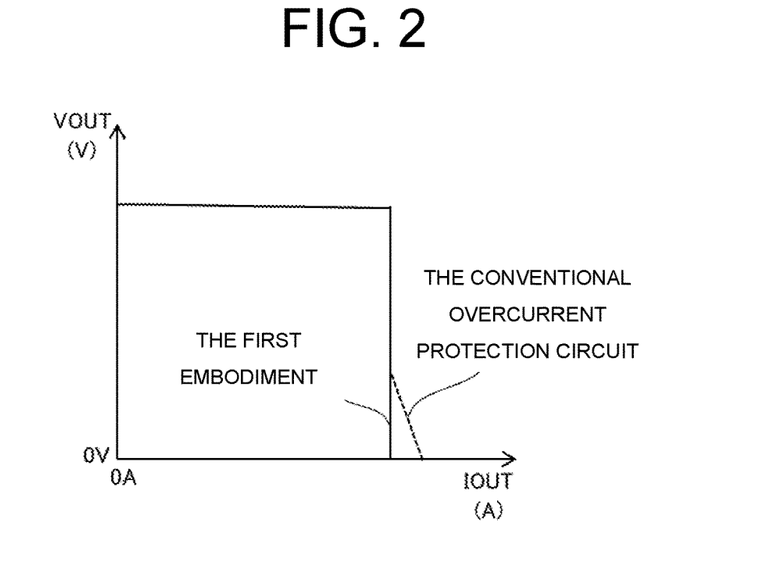
FIG. 2 is a graph illustrating characteristics of the overcurrent protection circuit according to the first embodiment.

FIG. 2 is a graph illustrating characteristics of the overcurrent protection circuit according to the first embodiment.

In the graph of FIG. 2, a vertical axis represents the output voltage VOUT, and a horizontal axis represents the output current IOUT. In response to an increase of the output current IOUT, in the conventional overcurrent protection circuit, as illustrated by a dashed line in FIG. 2, if the output voltage VOUT is equal to or lower than a predetermined voltage, it is impossible to make the drain voltage of the output transistor 11 coincide with the drain voltage of the sense transistor 13; thus, the output current IOUT increases as the output voltage VOUT decreases. Output current values are different from each other which are limited to a case where the output voltage VOUT is high and a case where the output terminal 3 is grounded (VOUT=0 V), and detection accuracy of an overcurrent is reduced. According to characteristics of the overcurrent protection circuit of the first embodiment, even in a case where the drain voltage of the output transistor 11 does not coincide with the drain voltage of the sense transistor 13 as represented by a solid line in FIG. 2, a constant output current IOUT is maintained in a wide output voltage VOUT range; thus, high detection accuracy of the overcurrent can be maintained even in a case where the output terminal 3 is grounded.

Figure 3:
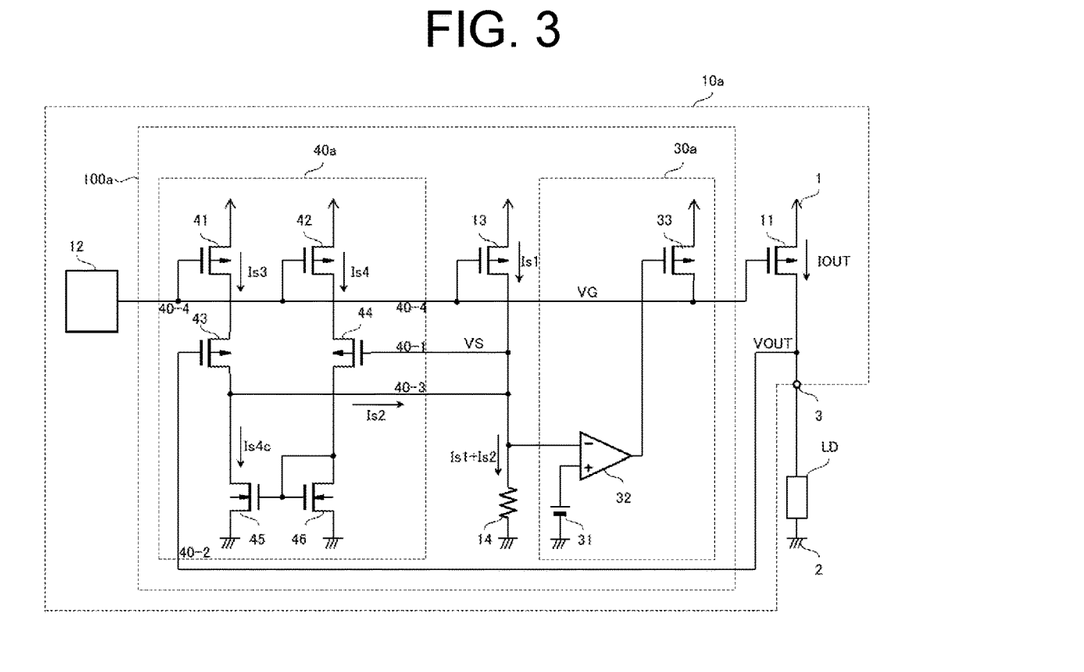
FIG. 3 is a circuit diagram illustrating an example of a current limiting circuit and a current correction circuit according to the first embodiment.

FIG. 3 is a circuit diagram illustrating an example of the current limiting circuit and the current correction circuit according to the first embodiment.

In the circuit diagram of FIG. 3, components similar to those in FIG. 1 are denoted by the same reference numerals, and detailed descriptions thereof are omitted.

Here, an example of the current limiting circuit 30 of FIG. 1 will be described in detail as a current limiting circuit 30a, and an example of the current correction circuit 40 will be described as a current correction circuit 40a.

The current limiting circuit 30a includes a reference voltage source 31, a comparator 32, and a PMOS transistor 33.

The current correction circuit 40a includes PMOS transistors 41, 42, 43, and 44 as first, second, third, and fourth transistors, and NMOS transistors 45 and 46.

A connection of the current limiting circuit 30a of FIG. 3 will be described.

The reference voltage source 31 is connected between a non-inverting input terminal of the comparator 32 and the ground terminal 2.

An inverting input terminal of the comparator 32 is connected to an input terminal of the current limiting circuit 30a, and an output terminal thereof is connected to a gate of the PMOS transistor 33.

The PMOS transistor 33 has a source connected to the power supply terminal 1 and a drain connected to an output terminal of the current limiting circuit 30a.

A connection of the current correction circuit 40a of FIG. 3 will be described.

The PMOS transistor 41 has a gate connected to the control terminal 40-4 of the current correction circuit 40a, a source connected to the power supply terminal 1, and a drain connected to a source of the PMOS transistor 43.

The PMOS transistor 42 has a gate connected to the control terminal 40-4 of the current correction circuit 40a, a source connected to the power supply terminal 1, and a drain connected to a source of the PMOS transistor 44.

The PMOS transistor 43 has a gate connected to the drain of the output transistor 11 via a second input terminal 40-2 of the current correction circuit 40a, and a drain connected to a drain of the NMOS transistor 45 and an output terminal 40-3 of the current correction circuit 40a.

The PMOS transistor 44 has a gate connected to the drain of the sense transistor 13 via the first input terminal 40-1 of the current correction circuit 40a, and a drain connected to a gate and a drain of the NMOS transistor 46 and a gate of the NMOS transistor 45.

Sources of the NMOS transistor 45 and the NMOS transistor 46 are connected to the ground terminal 2.

An operation of the current limiting circuit 30a of FIG. 3 will be described.

A reference voltage source 31 provides a predetermined reference voltage.

In a case where the output current IOUT is reduced and the sense voltage VS generated by the sense resistor 14 is less than the reference voltage, the comparator 32 provides an "H" level voltage to the gate of the PMOS transistor 33. If the "H" level voltage is provided to the gate of the PMOS transistor 33, the PMOS transistor 33 is turned off and does not limit the output current IOUT of the output transistor 11.

If the output current IOUT increases and the sense voltage VS is equal to or higher than the reference voltage, the comparator 32 provides an "L" level voltage to the gate of the PMOS transistor 33. If the "L" level voltage is provided to the gate of the PMOS transistor 33, the PMOS transistor 33 is turned on and limits a gate-source voltage of the output transistor 11.

As such, the current limiting circuit 30a controls the output transistor 11 based on the sense voltage VS such that the output current IOUT does not exceed a predetermined limit current.

An operation of the current correction circuit 40a of FIG. 3 will be described.

Since gate-source voltages of the PMOS transistors 41 and 42 are equal to a gate-source voltage of the output transistor 11, the PMOS transistors 41 and 42 respectively provide currents Is3 and Is4 proportional to the output current IOUT. The current Is4 flows through the PMOS transistor 44 to the NMOS transistor 46. Since the NMOS transistors 45 and 46 configure a current mirror circuit, the NMOS transistor 45 provide a current Is4c substantially proportional to the current Is4. The current Is3 flows through the PMOS transistor 43, and a difference current between the current Is3 and the current Is4 c is provided from the output terminal 40-3 of the current correction circuit 40a as the corrected sense current Is2.

A drain voltage of the PMOS transistor 41 is higher than the output voltage VOUT by an amount corresponding to a gate-source voltage of the PMOS transistor 43. A drain voltage of the PMOS transistor 42 is higher than the sense voltage VS by an amount corresponding to a gate-source voltage of the PMOS transistor 44. A difference between the drain voltage of the PMOS transistor 41 and the drain voltage of the PMOS transistor 42 substantially coincides with the difference of voltage ΔV between the output voltage VOUT and the sense voltage VS. The corrected sense current Is2=Is3−Is4c offsets a deviation in a ratio between the output current IOUT and the sense current Is1 which is caused by a drain voltage difference ΔV between drains of the output transistor 11 and the sense transistor 13.

For example, in the case of IOUT»Is1 and VS<VOUT, a ratio IOUT/Is1 under influence of a channel length modulation effect is reduced. At this time, since Is3<Is4 in the current correction circuit 40a, in the case of a positive direction of each current in FIG. 3, the corrected sense current Is2 has a negative value. In the case of the negative corrected sense current Is2, a corrected ratio IOUT/(Is1+Is2) is increased and offsets a change in the ratio IOUT/Is1 due to the channel length modulation effect. In contrast to this, in the case of VS>VOUT, the ratio IOUT/Is1 is increased, but since the corrected sense current Is2 has a positive value, the change in the ratio IOUT/Is1 is offset in the same manner.

As such, by virtue of an operation of the current correction circuit 40a, even in a case where the output terminal 3 is grounded and the drain voltage of the output transistor 11 does not coincide with the drain voltage of the sense transistor 13, a current exactly proportional to the output current flows through the sense resistor 14; thus, high detection accuracy of an overcurrent can be maintained without being affected by a channel length modulation effect.

In order for the corrected sense current Is2 to function as desired, characteristics of the channel length modulation effect in the output transistor 11, the sense transistor 13, and the PMOS transistors 41 and 42 need to coincide with each other.

Here, a drain current Id at the time of saturation of a MOS transistor is represented by following Equation (1).

Equation 1

$$I_d = \frac{1}{2}\mu C_{ox}\frac{W}{L}(V_{GS} - V_{th})^2(1 + \lambda V_{DS}) \tag{1}$$

In Equation (1) above, μ is mobility, Cox is a gate oxide film capacity per unit area, W/L is an aspect ratio of a gate size of a transistor, Vth is a threshold voltage, and λ is a channel length modulation coefficient.

A channel length modulation effect is represented by a term $(1+\lambda V_{DS})$ in Equation (1) above. λ is inversely proportional to a gate length L in a channel length direction of a MOS transistor. The length L of a pair of the output transistor 11 and the PMOS transistor 41, and a length L of a pair of the sense transistor 13 and the PMOS transistor 42 are designed to have the same size. It is also preferable to design the length L of a pair of the output transistor 11 and the sense transistor 13 to be the same size.

Figure 4:
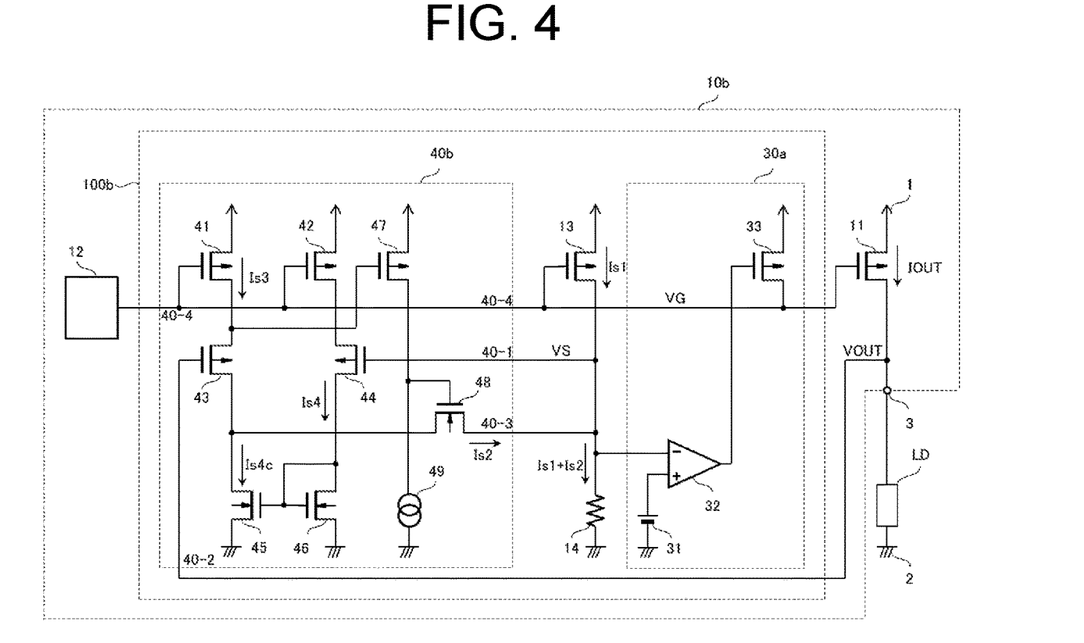
FIG. 4 is a circuit diagram illustrating another example of the current correction circuit according to the first embodiment.

FIG. 4 is a circuit diagram illustrating another example of the current correction circuit according to the first embodiment.

A current correction circuit 40b of FIG. 4 includes a PMOS transistor 47 as a fifth transistor, an NMOS transistor 48, and a current source 49 in addition to the configuration of the current correction circuit 40a of FIG. 3.

In the circuit diagram of FIG. 4, components similar to those in FIG. 3 are denoted by the same reference numerals, and detailed descriptions thereof are omitted.

A PMOS transistor 47 has a gate connected to the drain of the PMOS transistor 41, a source connected to the power supply terminal 1, and a drain connected to a gate of the NMOS transistor 48 and one terminal of a current source 49. The other terminal of the current source 49 is connected to the ground terminal 2.

One of a source and a drain of the NMOS transistor 48 is connected to the drain of the NMOS transistor 45, and the other is connected to an output terminal 40-3 of the current correction circuit 40b.

An operation of the current correction circuit 40b of FIG. 4 will be described.

The current correction circuit 40b of FIG. 4 is different from the current correction circuit 40a of FIG. 3 in that the corrected sense current Is2 is provided via the NMOS transistor 48.

Specifically, in a case where the source-drain voltage of the PMOS transistor 41 is reduced and the PMOS transistor 41 performs a non-saturation operation, the gate-source voltage of the PMOS transistor 47 becomes equal to or lower than the threshold voltage of the transistor and the PMOS transistor 47 turns off. Then, the gate voltage of the NMOS transistor 48 is put in the ground voltage level by the current source 49 and the NMOS transistor 48 turns off. In response to turn-off of the NMOS transistor 48, the corrected sense current Is2 is not provided to the sense resistor 14.

Meanwhile, in a case where a source-drain voltage of the PMOS transistor 41 is high and the PMOS transistor 41 performs a saturation operation, a gate-source voltage of the PMOS transistor 47 exceeds a threshold voltage of the transistor, and the PMOS transistor 47 turns on. Then, the gate voltage of the NMOS transistor 48 is put in a power supply voltage level and the NMOS transistor 48 turns on. In response to turn-on of the NMOS transistor 48, the corrected sense current Is2 is provided to the sense resistor 14.

In the current correction circuit 40a of FIG. 3, there is a difference between the drain voltages of the output transistor 11 and the PMOS transistor 41 by the gate-source voltage of the PMOS transistor 43, and although the output transistor 11 performs a saturation operation, the PMOS transistor 41 can perform a non-saturation operation. In this case, an error occurs in offsetting a change in a ratio between the output current IOUT and the sense current Is1 due to the corrected sense current Is2.

According to the current correction circuit 40b of FIG. 4, since the corrected sense current Is2 is provided only in response to a saturation operation of the PMOS transistor 41, an error of current correction due to a difference between operation states of the output transistor 11 and the PMOS transistor 41 can be suppressed, and detection accuracy of an overcurrent can be further enhanced.

Second Embodiment

Figure 5:
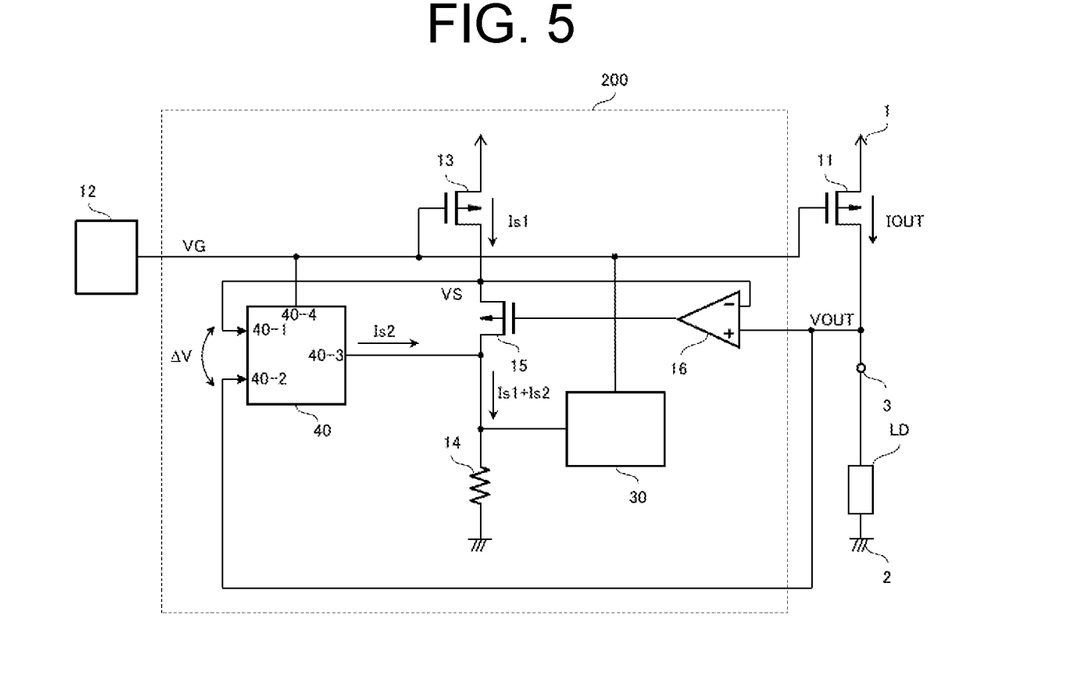
FIG. 5 is a circuit diagram illustrating an overcurrent protection circuit according to a second embodiment.

FIG. 5 is a circuit diagram illustrating an overcurrent protection circuit according to a second embodiment.

An overcurrent protection circuit 200 of FIG. 5 includes a PMOS transistor 15 as a sixth transistor and an amplifier 16 in addition to the configuration of the overcurrent protection circuit 100 of FIG. 1.

In the circuit diagram of FIG. 5, components similar to those in FIG. 1 are denoted by the same reference numerals, and detailed descriptions thereof are omitted.

A connection of the overcurrent protection circuit 200 of FIG. 5 will be described.

A PMOS transistor 15 has a gate connected to an output terminal of the amplifier 16, a source connected to a drain of the sense transistor 13 and an inverting input terminal of the amplifier 16, and a drain connected to one terminal of the sense resistor 14. A non-inverting input terminal of the amplifier 16 is connected to the output terminal 3.

An operation of the overcurrent protection circuit 200 of FIG. 5 will be described.

In response to a high output voltage VOUT, the PMOS transistor 15 and the amplifier 16 are in an operating voltage range, and the amplifier 16 controls a gate voltage of the PMOS transistor 15 so as to make voltages of the inverting input terminal and the non-inverting input terminal coincide with each other. As a result, a drain voltage VS of the sense transistor 13 is operative to coincide with the output voltage VOUT of the output terminal. At this time, since the voltage difference ΔV between the sense voltage VS and the output voltage VOUT is approximately zero, the corrected sense current Is2 provided by the current correction circuit 40 is approximately zero, and only the sense current Is1 flows through the sense resistor 14. Since the sense voltage VS approximately coincides with the output voltage VOUT, a ratio between the sense current Is1 and the output current IOUT is not changed.

In response to a low output voltage VOUT, the PMOS transistor 15 and the amplifier 16 are out of the operating voltage range, and the sense voltage VS does not coincide with the output voltage VOUT. At this time, in the same manner as described in FIG. 1, since the current correction circuit 40 provides the corrected sense current Is2, a current obtained by adding the sense current Is1 to the corrected sense current Is2 flows through the sense resistor 14.

As such, in response to the high output voltage VOUT, detection accuracy of an overcurrent can be maintained by a circuit that makes a drain voltage of the output transistor 11 coincide with a drain voltage of the sense transistor 13, and in response to the low output voltage VOUT, the detection accuracy of the overcurrent is maintained by the current correction circuit 40.

In order to constantly maintain high detection accuracy of an overcurrent in a wide output voltage VOUT range, it is preferable that operating voltage ranges of the PMOS transistor 15 and the amplifier 16 overlap an operating voltage range in which the current correction circuit 40 normally operates.

According to the overcurrent protection circuit 200 of the second embodiment, the current correction circuit 40 may operate to provide the corrected sense current Is2 with high accuracy only in a state of VS>VOUT only in response to the low output voltage VOUT. This facilitates a design of the current correction circuit 40.

Figure 6:
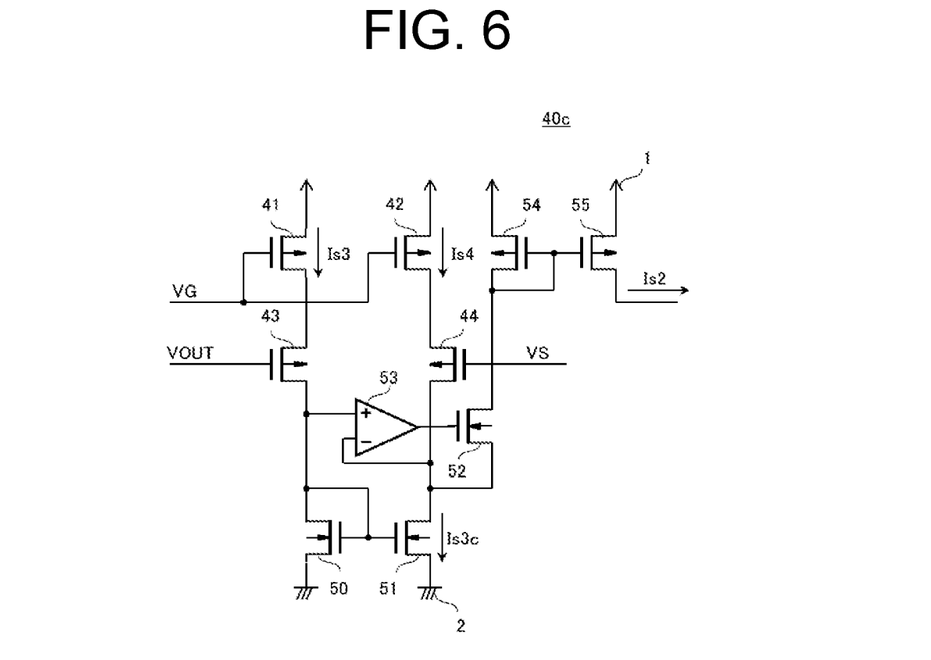
FIG. 6 is a circuit diagram illustrating a current correction circuit according to the second embodiment.

FIG. 6 is a circuit diagram illustrating a current correction circuit according to the second embodiment.

A current correction circuit 40c of FIG. 6 is the same as the current correction circuit 40a except that the NMOS transistors 45 and 46 in the current correction circuit 40a of FIG. 3 are replaced with NMOS transistors 50, 51, and 52, an amplifier 53, and PMOS transistors 54 and 55.

In the circuit diagram of FIG. 6, components similar to those in FIG. 3 are denoted by the same reference numerals, and detailed descriptions thereof are omitted.

A connection of a current correction circuit 40c of FIG. 6 will be described.

A drain of the PMOS transistor 43 is connected to a gate and a drain of the NMOS transistor 50, a gate of the NMOS transistor 51, and a non-inverting input terminal of the amplifier 53. Sources of the NMOS transistors 50 and 51 are connected to the ground terminal 2.

A drain of the PMOS transistor 44 is connected to a drain of the NMOS transistor 51, a source of the NMOS transistor 52, and an inverting input terminal of the amplifier 53.

A gate of the NMOS transistor 52 is connected to an output terminal of the amplifier 53.

A drain of the NMOS transistor 52 is connected to a gate and a drain of the PMOS transistor 54 and a gate of the PMOS transistor 55.

Sources of the PMOS transistors 54 and 55 are connected to the power supply terminal 1. A drain of the PMOS transistor 55 is connected to an output terminal 40-3 of the current correction circuit 40c.

An operation of the current correction circuit 40c of FIG. 6 will be described.

Since gate-source voltages of the PMOS transistors 41 and 42 are equal to a gate-source voltage of the output transistor 11, the PMOS transistors 41 and 42 respectively provide currents Is3 and Is4 proportional to the output current IOUT. The current Is3 flows through the PMOS transistor 43 to the NMOS transistor 50. Since the NMOS transistors 50 and 51 configure a current mirror circuit, the NMOS transistor 51 provides a current Is3c proportional to the current Is3. The current Is4 flows through the PMOS transistor 44, and a difference current between the currents Is3 c and Is4 flows through the NMOS transistor 52 to the PMOS transistor 54. Since the PMOS transistors 54 and 55 configure a current mirror circuit, the PMOS transistor 55 provides the corrected sense current Is2 from the output terminal 40-3 of the current correction circuit 40c.

In the current correction circuit 40a of FIG. 3, since drain voltages of the NMOS transistors 45 and 46 do not coincide with each other depending on the output current IOUT and an output terminal voltage of the current correction circuit 40a, a deviation occurs in a current mirror ratio between the NMOS transistors 45 and 46.

According to the current correction circuit 40c of FIG. 6, since the amplifier 53 controls a gate voltage of the NMOS transistor 52 so as to make drain voltages of the NMOS transistors 50 and 51 coincide with each other, the current Is3c is proportional to the current Is3 with higher accuracy regardless of the output current IOUT and the output terminal voltage of the current correction circuit 40a. A change in a ratio IOUT/Is1 due to a channel length modulation effect can be offset with higher accuracy.

Figure 7:
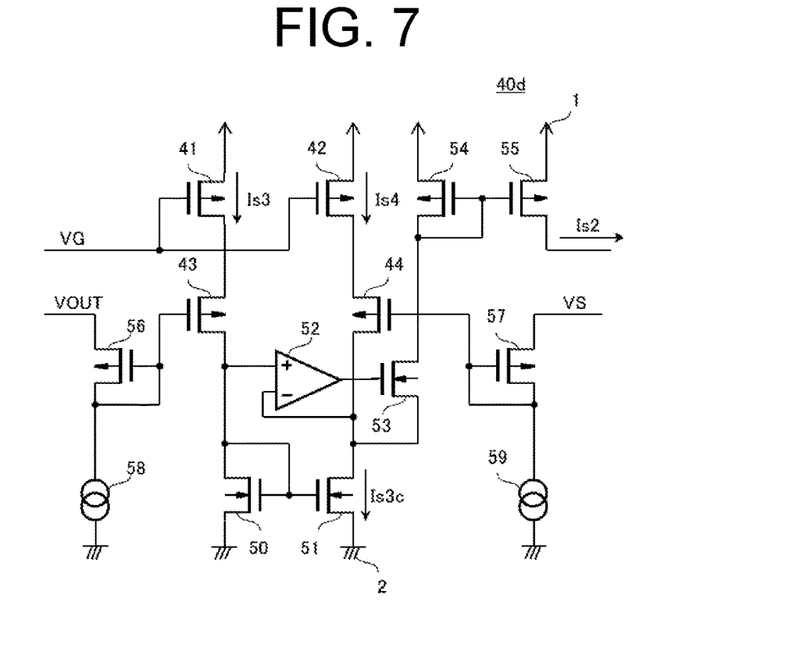
FIG. 7 is a circuit diagram illustrating another example of the current correction circuit according to the second embodiment.

FIG. 7 is a circuit diagram illustrating another example of the current correction circuit according to the second embodiment.

A current correction circuit 40d of FIG. 7 includes PMOS transistors 56 and 57 and constant current sources 58 and 59 in addition to the current correction circuit 40c of FIG. 6.

In the circuit diagram of FIG. 7, components similar to those in FIG. 6 are denoted by the same reference numerals, and detailed descriptions thereof are omitted.

a connection of the current correction circuit 40d of FIG. 7 will be described.

A gate of the PMOS transistor 43 is connected to a gate and a drain of the PMOS transistor 56 and one terminal of the current source 58. The other terminal of the current source 58 is connected to the ground terminal 2.

A source of the PMOS transistor 56 is connected to a second input terminal 40-2 of the current correction circuit 40d.

A gate of the PMOS transistor 44 is connected to a gate and a drain of the PMOS transistor 57 and one terminal of the current source 59. The other terminal of the current source 59 is connected to the ground terminal 2.

A source of the PMOS transistor 57 is connected to a first input terminal 40-1 of the current correction circuit 40d.

An operation of the current correction circuit 40d of FIG. 7 will be described.

A gate voltage of the PMOS transistor 56 is lower than an output voltage VOUT provided to a second input terminal 40-2 of the current correction circuit 40d by an amount corresponding to the gate-source voltage of the PMOS transistor 56. A gate voltage of the PMOS transistor 57 is also lower than a sense voltage VS provided to the first input terminal 40-1 by an amount corresponding to a gate-source voltage of the PMOS transistor 57.

In the current correction circuit 40c of FIG. 6, in response to a low power supply voltage of the power supply terminal 1, source-drain voltages of the PMOS transistors 41 and 42 are reduced, and although the output transistor 11 performs a saturation operation, the PMOS transistors 41 and 42 can perform a non-saturation operation. In this case, an error occurs in offsetting a change in a ratio between the output current IOUT and the sense current Is1 due to the corrected sense current Is2.

According to the current correction circuit 40d of FIG. 7, since gate voltages of the PMOS transistors 43 and 44 are respectively lower than the output voltage VOUT and the sense voltage VS, the respective source voltages of the PMOS transistors 43 and 44 are also reduced, and the PMOS transistors 41 and 42 are easy to perform a saturation operation. An error of current correction due to a difference between operation states of the output transistor 11 and the PMOS transistors 41 and 42 can be suppressed, and detection accuracy of an overcurrent at the time of the low power supply voltage can be enhanced.

Figure 8:
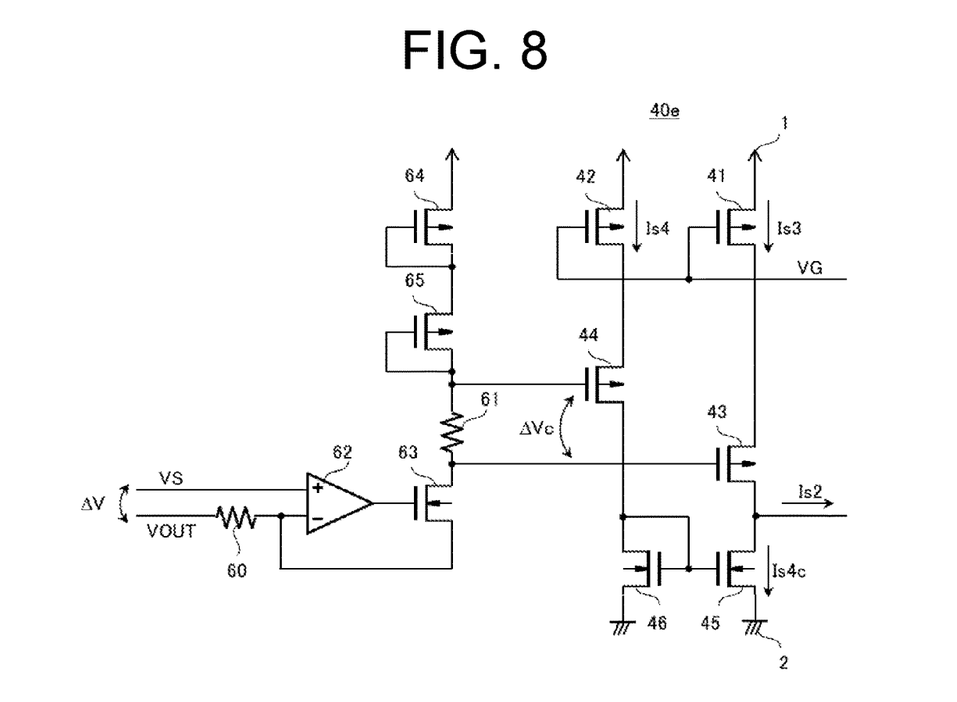
FIG. 8 is a circuit diagram illustrating another example of the current correction circuit according to the second embodiment.

FIG. 8 is a circuit diagram illustrating another example of the current correction circuit according to the second embodiment.

A current correction circuit 40e of FIG. 8 includes resistors 60 and 61 as a first resistor and a second resistor, an amplifier 62, an NMOS transistor 63, and PMOS transistors 64 and 65, in addition to the current correction circuit 40a of FIG. 3.

In the circuit diagram of FIG. 8, components similar to those in FIG. 3 are denoted by the same reference numerals, and detailed descriptions thereof are omitted.

A connection of the current correction circuit 40e of FIG. 8 will be described.

The amplifier 62 has a non-inverting input terminal connected to a first input terminal 40-1 of the current correction circuit 40e, an inverting input terminal connected to one terminal of the resistor 60 and a source of the NMOS transistor 63, and an output terminal connected to a gate of the NMOS transistor 63. The other terminal of the resistor 60 is connected to a second input terminal 40-2 of the current correction circuit 40e.

A drain of the NMOS transistor 63 is connected to one terminal of the resistor 61 and a gate of the PMOS transistor 43. The other terminal of the resistor 61 is connected to a gate of the PMOS transistor 44 and a gate and a drain of the PMOS transistor 65.

A source of the PMOS transistor 65 is connected to a gate and a drain of the PMOS transistor 64. A source of the PMOS transistor 64 is connected to the power supply terminal 1.

An operation of the current correction circuit 40e of FIG. 8 will be described.

The amplifier 62 controls a gate voltage of the NMOS transistor 63 so as to make a voltage of the inverting input terminal coincide with a voltage of the non-inverting input. The voltage of the inverting input terminal of the amplifier 62 is the same as the sense voltage VS, and a voltage equal to the voltage difference ΔV between the sense voltage VS and the output voltage VOUT is generated at both ends of the resistor 60. The voltage difference ΔV is voltage-to-current converted by the resistor 60, and a current proportional to the voltage difference ΔV flows through the resistor 60. The current flowing through the resistor 60 flows to the resistor 61 through the source and drain of the NMOS transistor 63. If resistance values of the resistor 60 and the resistor 61 are designed to be equal to each other, a voltage ΔVc equal to the voltage difference ΔV is generated at both ends of the resistor 61. Since a gate voltage difference between the PMOS transistors 43 and 44 is ΔVc, the corrected sense current Is2 for offsetting a deviation of a ratio between the output current IOUT and the sense current Is1 caused by the voltage difference ΔV is provided from the output terminal 40-3 of the current correction circuit 40e in the same manner as in the current correction circuit of FIG. 3.

The gate voltage of the PMOS transistor 44 is lower than the power supply voltage by an amount corresponding to the gate-source voltages of the PMOS transistors 64 and 65. Since a source voltage of the PMOS transistor 44 is also reduced, the PMOS transistor 42 is easy to perform a saturation operation, and although the output transistor 11 performs a saturation operation, the PMOS transistor 42 can avoid to perform a non-saturation operation.

According to the current correction circuit 40e of FIG. 8, even in a case where the output voltage VOUT becomes a negative voltage lower than a voltage of the ground terminal 2, the corrected sense current Is2 is provided based on the voltage difference ΔV between the sense voltage VS and the output voltage VOUT. A change in a ratio IOUT/Is1 due to a channel length modulation effect can be offset over a wider output voltage VOUT range including a negative voltage.

Third Embodiment

Figure 9:
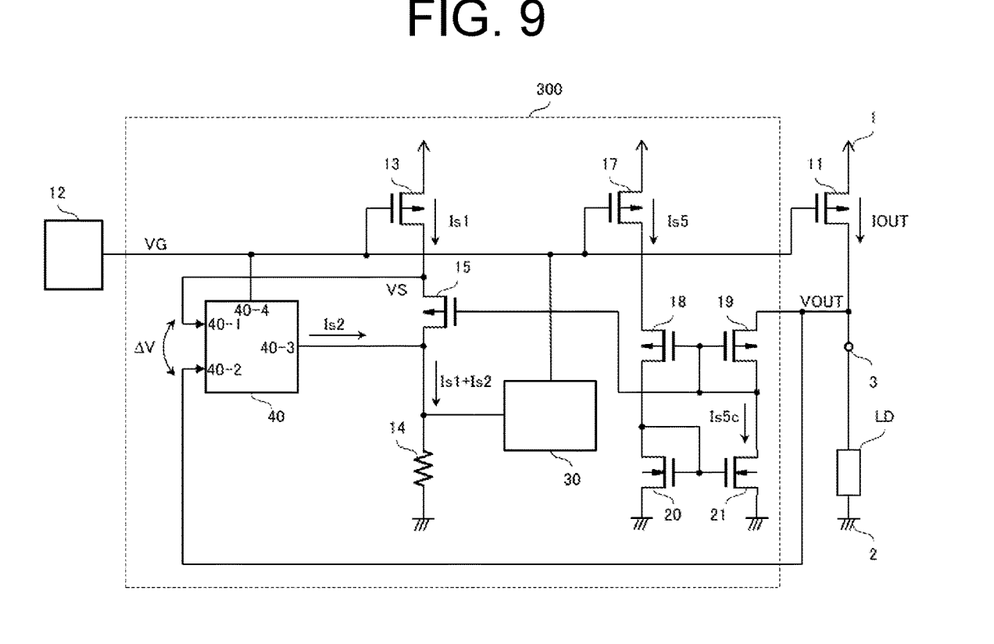
FIG. 9 is a circuit diagram illustrating an overcurrent protection circuit according to a third embodiment.

FIG. 9 is a circuit diagram illustrating an overcurrent protection circuit according to a third embodiment.

An overcurrent protection circuit 300 of FIG. 9 is the same as the overcurrent protection circuit 200 of FIG. 5 except that the amplifier 16 in the overcurrent protection circuit 200 of FIG. 5 is replaced with PMOS transistors 17, 18, and 19 and the NMOS transistors 20 and 21.

In the circuit diagram of FIG. 9, components similar to those in FIG. 5 are denoted by the same reference numerals, and detailed descriptions thereof are omitted.

A connection of the overcurrent protection circuit 300 of FIG. 9 will be described.

The PMOS transistor 17 has a gate connected to a gate of the sense transistor 13, a source connected to the power supply terminal 1, and a drain connected to a source of the PMOS transistor 18. A gate of the PMOS transistor 18 is connected to a gate and a drain of the PMOS transistor 19, a gate of the PMOS transistor 15, and a drain of the NMOS transistor 21. A drain of the PMOS transistor 18 is connected to a gate and a drain of the NMOS transistor 20 and a gate of the NMOS transistor 21. Sources of the NMOS transistors 20 and 21 are connected to the ground terminal 2.

An operation of the overcurrent protection circuit 300 of FIG. 9 will be described.

The PMOS transistor 17 provides a second sense current Is5 proportional to the sense current Is1 provided by the sense transistor 13. The second sense current Is5 flows to the NMOS transistor 20 through the PMOS transistor 18. Since the NMOS transistors 20 and 21 configure a current mirror circuit, the NMOS transistor 21 provides a current Is5c proportional to the current Is5. The current Is5c flows through the PMOS transistor 19. By appropriately designing a size of each transistor, a drain voltage of the PMOS transistor 17 and a drain voltage (the sense voltage VS) of the sense transistor 13 each coincide with the output voltage VOUT.

Since both the second sense current Is5 and the current Is5c proportional to the second sense current Is5 are reduced in response to a reduced output current IOUT, the overcurrent protection circuit 300 consumes a small amount of current.

The overcurrent protection circuit 300 according to the third embodiment can obtain the same effect as the overcurrent protection circuit 200 according to the second embodiment and can reduce current consumption.

Fourth Embodiment

Figure 10:
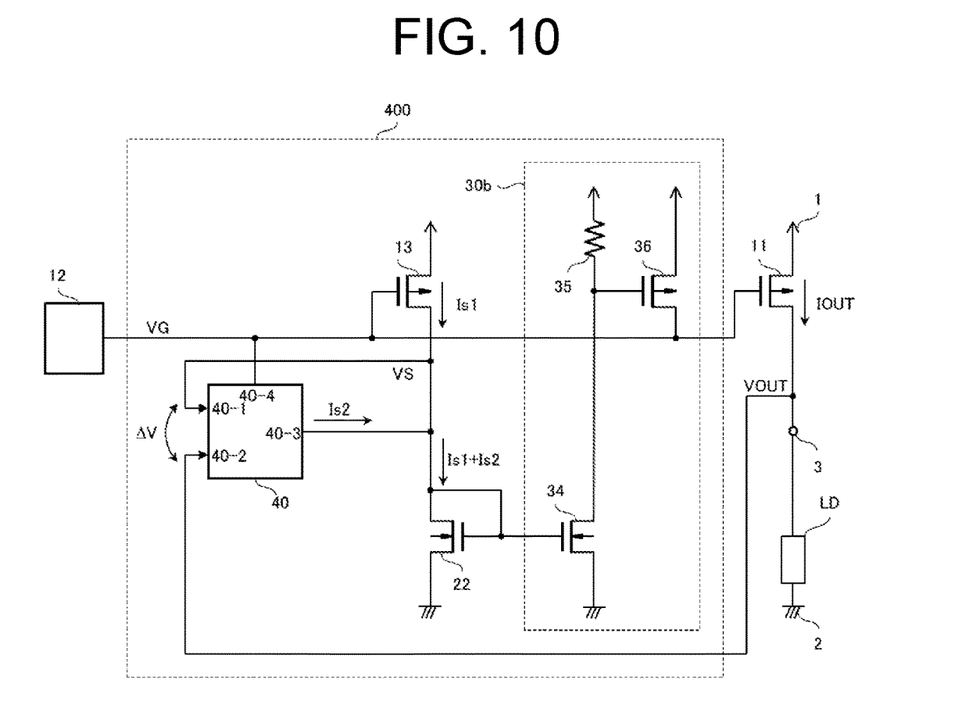
FIG. 10 is a circuit diagram illustrating another example of an overcurrent protection circuit and a current limiting circuit according to a fourth embodiment.

FIG. 10 is a circuit diagram illustrating another example of the overcurrent protection circuit and the current limiting circuit according to a fourth embodiment.

An overcurrent protection circuit 400 of FIG. 10 is the same as the overcurrent protection circuit 100 of FIG. 1 except that the sense resistor 14 in the overcurrent protection circuit 100 of FIG. 1 is replaced with an NMOS transistor 22. A current limiting circuit 30b includes an NMOS transistor 34, a resistor 35, and a PMOS transistor 36.

In the circuit diagram of FIG. 10, components similar to those in FIG. 1 are denoted by the same reference numerals, and detailed descriptions thereof are omitted.

Connections of the overcurrent protection circuit 400 and the current limiting circuit 30b of FIG. 10 will be described.

The NMOS transistor 22 has a gate and a drain connected to the output terminal 40-3 of the current correction circuit 40 and an input terminal of the current limiting circuit 30b, and a source connected to the ground terminal 2.

The NMOS transistor 34 has a gate connected to the input terminal of the current limiting circuit 30b, a source connected to the ground terminal 2, and a drain connected to one terminal of the resistor 35 and a gate of the PMOS transistor 36. The other terminal of the resistor 35 is connected to the power supply terminal 1.

The PMOS transistor 36 has a source connected to the power supply terminal 1 and a drain connected to an output terminal of the current limiting circuit 30b.

Operations of the overcurrent protection circuit 400 and the current limiting circuit 30b of FIG. 10 will be described.

A current obtained by adding the sense current Is1 provided by the sense transistor 13 to the corrected sense current Is2 provided by the current correction circuit 40 flows through the NMOS transistor 22. A sense voltage based on a current Is1+Is2 is generated as a gate-drain voltage of the NMOS transistor 22 to be provided to the input terminal of the current limiting circuit 30b.

The NMOS transistor 34 receives the sense voltage through a gate thereof and provides a voltage to the resistor 35 proportional to the current Is1+Is2. A voltage proportional to the current Is1+Is2 is generated at both ends of the resistor 35.

In a case where the output current IOUT is reduced and the voltage generated by the resistor 35 is less than a threshold voltage of the PMOS transistor 36, the PMOS transistor 36 is turned off; thus, the output current IOUT of the output transistor 11 is not limited.

In a case where the output current IOUT increases and the voltage generated by the resistor 35 is equal to or higher than a threshold voltage of the PMOS transistor 36, the PMOS transistor 36 is turned on; thus, a gate-source voltage of the output transistor 11 is limited.

As such, the current limiting circuit 30b controls the output transistor 11 such that the output current IOUT does not exceed a predetermined limit current.

According to the overcurrent protection circuit 400 of the fourth embodiment, the overcurrent protection circuit can be configured with a small number of elements; thus, the same effect as that in the overcurrent protection circuit according to the first embodiment can be obtained with a smaller circuit area.

Although embodiments of the present invention are described above, the present invention is not limited to the embodiments described above, and it is needless to say that various modifications can be made without departing from the idea of the present invention.

For example, the current limiting circuit 30b of FIG. 10 may be applied to each of the overcurrent protection circuits according to the first, second, and third embodiments.

What is claimed is:

1. An overcurrent protection circuit configured to limit an output current flowing through an output transistor, the overcurrent protection circuit comprising:
a sense transistor through which a sense current proportional to the output current flows;
a sense resistor through which the sense current flows;
a current limiting circuit that detects a sense voltage generated in the sense resistor and controls a gate voltage of the output transistor; and
a current correction circuit that causes a corrected sense current added to the sense current to flow through the sense resistor based on a difference of voltage between a drain voltage of the output transistor and a drain voltage of the sense transistor,
wherein
the current correction circuit includes a first input terminal connected to a drain of the sense transistor, a second input terminal connected to a drain of the output transistor, and an output terminal connected to the sense resistor, and causes the corrected sense current to flow from the output terminal; and
wherein
the current correction circuit includes a control terminal connected to a gate of the sense transistor, a first transistor and a second transistor each having a gate connected to the control terminal, a third transistor having a source connected to a drain of the first transistor, and a fourth transistor having a source connected to a drain of the second transistor, and
a gate voltage difference between the third transistor and the fourth transistor corresponds to a drain voltage difference between the sense transistor and the output transistor, and a difference current between a current flowing through the first transistor and a current flowing through the second transistor flows as the corrected sense current.

2. The overcurrent protection circuit according to claim 1, wherein gate lengths of the first transistor and the output transistor are equal to each other, and gate lengths of the second transistor and the sense transistor are equal to each other.

3. The overcurrent protection circuit according to claim 1, wherein
the current correction circuit further includes a fifth transistor having a gate connected to the drain of the first transistor, and
the current correction circuit switches on/off of an output of the corrected sense current according to an on/off state of the fifth transistor.

4. The overcurrent protection circuit according to claim 1, wherein a gate of the third transistor is connected to the second input terminal, and a gate of the fourth transistor is connected to the first input terminal.

5. The overcurrent protection circuit according to claim 1, wherein
the current correction circuit includes a first resistor, a second resistor, and an amplifier having a non-inverting input terminal connected to the first input terminal and an inverting input terminal connected to one terminal of the first resistor,
the other terminal of the first resistor is connected to the second input terminal,
a current flowing through the first resistor flows to the second resistor, and
both ends of the second resistor are respectively connected to a gate of the third transistor and a gate of the fourth transistor.

6. The overcurrent protection circuit according to claim 1, further comprising:
a sixth transistor having a source connected to the sense transistor and a drain connected to the sense resistor,
wherein a source voltage of the sixth transistor coincides with the drain voltage of the output transistor.

7. The overcurrent protection circuit according to claim 1, further comprising:
a sixth transistor having a source connected to the sense transistor and a drain connected to the sense resistor,
wherein a source voltage of the sixth transistor coincides with the drain voltage of the output transistor.

8. The overcurrent protection circuit according to claim 1, further comprising:
a sixth transistor having a source connected to the sense transistor and a drain connected to the sense resistor,
wherein a source voltage of the sixth transistor coincides with the drain voltage of the output transistor.

9. The overcurrent protection circuit according to claim 2, further comprising:
a sixth transistor having a source connected to the sense transistor and a drain connected to the sense resistor,
wherein a source voltage of the sixth transistor coincides with the drain voltage of the output transistor.

10. A load drive device comprising:
an output transistor that causes an output current to flow through a load;
a control circuit that controls a gate voltage of the output transistor; and
the overcurrent protection circuit according to claim 1 that limits the output current according to the gate voltage and a drain voltage of the output transistor.

* * * * *